(12) United States Patent
Cocchini et al.

(10) Patent No.: US 11,768,225 B2
(45) Date of Patent: Sep. 26, 2023

(54) REMOVABLE CONTACTLESS PROBE

(71) Applicant: International Business Machines Corporation, Armonk, NY (US)

(72) Inventors: Matteo Cocchini, New York, NY (US);
Kyle Olson, Lagrangeville, NY (US);
Noah Singer, White Plains, NY (US)

(73) Assignee: International Business Machines Corporation, Armonk, NY (US)

( * ) Notice: Subject to any disclaimer, the term of this patent is extended or adjusted under 35 U.S.C. 154(b) by 79 days.

(21) Appl. No.: 17/361,475

(22) Filed: Jun. 29, 2021

(65) Prior Publication Data
US 2022/0413012 A1    Dec. 29, 2022

(51) Int. Cl.
*G01R 1/07*   (2006.01)
*H05K 1/18*   (2006.01)
*H05K 1/11*   (2006.01)
*H01P 3/08*   (2006.01)

(52) U.S. Cl.
CPC ............... *G01R 1/07* (2013.01); *H01P 3/081* (2013.01); *H05K 1/111* (2013.01); *H05K 1/181* (2013.01); *H05K 2201/10151* (2013.01)

(58) Field of Classification Search
CPC .. G01R 31/42; G01R 19/16528; G01R 31/44; G01R 31/50; G01R 31/52; G01R 31/282
USPC ........................................................ 324/126
See application file for complete search history.

(56) References Cited

U.S. PATENT DOCUMENTS

| | | | |
|---|---|---|---|
| 4,851,767 A | 7/1989 | Halbout | |
| 4,961,050 A * | 10/1990 | Harwood | G01R 1/04 333/260 |
| 5,218,294 A | 6/1993 | Soiferman | |
| 5,424,633 A | 6/1995 | Soiferman | |
| 5,923,181 A * | 7/1999 | Beilstein, Jr. | G01R 31/2863 324/750.19 |
| 6,445,204 B1 | 9/2002 | He | |
| 7,468,612 B2 * | 12/2008 | Nickson | A61B 5/05 324/754.02 |
| 7,595,650 B2 * | 9/2009 | Funato | G01R 33/06 324/754.29 |
| 9,244,145 B2 | 1/2016 | Min | |
| 9,642,014 B2 | 5/2017 | Keller | |
| 10,041,987 B2 | 8/2018 | Hoang | |
| 10,663,486 B2 | 5/2020 | Cocchini | |
| 2016/0091411 A1 * | 3/2016 | Hedtke | G01N 17/00 324/700 |
| 2018/0224480 A1 | 8/2018 | Cocchini | |

OTHER PUBLICATIONS

Anonymous. "Microstrip differential impedance." Printed May 17, 2021. 4 pages. Published by QuickField. https://quickfield.com/advanced/microstrip_differential_impedance.htm.

(Continued)

*Primary Examiner* — Farhana A Hoque
(74) *Attorney, Agent, or Firm* — Heather Johnston (57) ABSTRACT

A system may include a printed circuit board with a microstrip and a conductive structure surrounding the microstrip. The system may include a probe lead in communication with the conductive structure. The system may include a first contact pad electrically connected to the conductive structure and a second contact pad electrically connected to the conductive structure.

20 Claims, 11 Drawing Sheets

(56) References Cited

OTHER PUBLICATIONS

Cocchini, et al., "Minimally Invasive 3D Printed Fixtures for Multi GB/s Channel Characterization with a Logic Analyzer." Published in 2020. 6 pages. In IEEE 70th Electronic Components and Technology Conference (ECTC), pp. 946-951. Published by IEEE. https://ieeexplore.ieee.org/document/9159452.

Luo, et al., "Collocated and simultaneous measurements of RF current and voltage on a trace in a noncontact manner." Published Jun. 2019. 10 pages. In IEEE Transactions on Microwave Theory and Techniques, vol. 67, No. 6, pp. 2406-2415. Published by IEEE. https://ieeexplore.ieee.org/document/8685702.

* cited by examiner

REMOVABLE CONTACTLESS PROBE

BACKGROUND

The present disclosure relates to signal measurements and more specifically to signal integrity measurements.

Signal integrity (SI) indicates electrical signal quality. SI tests may be performed to assess signal quality. Traditional techniques for performing measurements may include soldering probe tips into a location in a printed circuit board (PCB) to enable measurement at that location in the PCB. Traditional techniques may not be suited to measuring high speed signals because, for example, high speed signals may be detrimentally impacted by traditional techniques because soldering probe tips directly to the traces or via may compromise the signal integrity at the actual channel receiver. Additionally, traditional techniques such as soldering may be time consuming and introduce the risk of damaging the PCB.

SUMMARY

Embodiments of the present disclosure include systems and methods for signal measurements.

A system in accordance with the present disclosure may include a printed circuit board with a microstrip and a conductive structure surrounding the microstrip. The system may include a probe lead in communication with the conductive structure. The system may include a first contact pad electrically connected to the conductive structure and a second contact pad electrically connected to the conductive structure.

The above summary is not intended to describe each illustrated embodiment or every implement of the disclosure.

BRIEF DESCRIPTION OF THE DRAWINGS

The drawings included in the present application are incorporated into, and form part of, the specification. They illustrate embodiments of the present disclosure and, along with the description, serve to explain the principles of the disclosure. The drawings are only illustrative of certain embodiments and do not limit the disclosure.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention.

DETAILED DESCRIPTION

Aspects of the present disclosure relate to signal measurements and more specifically to signal integrity measurements.

Probing a high-speed signal on or near the surface of a printed circuit board (PCB) using a near field-type structure may avoid requiring probe tips to be directly soldered to the PCB. Probing a signal on or near the surface of a PCB may also reduce time required for manufacture and/or measurement as it circumvents the need for soldering time to solder the probe tips to the PCB. Probing a signal on or near the surface of a PCB may further reduce the risk of human error. A measurement performed in accordance with the present disclosure may be performed simply by plugging the measurement apparatus in to measure the signal integrity, and the measurement apparatus may be disconnected after measurement and used to measure the signal integrity on another device.

The present disclosure may enable the reduction and/or elimination of soldering and, therefore, lab technician time spent soldering. The present disclosure may enable a fast connection to an interface, measurement of signal integrity, and disconnection from the interface. The present disclosure may reduce the risk of damaging PCB traces. The present disclosure may provide flexibility as to where measurements may be taken because the measurement may be taken in any relatively open area on an interface and does not require soldering probe tips to vias. The present disclosure may provide a method of measurement that is minimally invasive electrically.

A structure in accordance with the present disclosure may include a structure embedded in a PCB in accordance with standard PCB manufacturing technologies. The embedded structure may be a surface mount. In some embodiments, the embedded structure may be optimally produced with additive manufacturing; in some embodiments, other manufacturing techniques may be used. Additive manufacturing may be preferred in certain scenarios such as for low production volumes, custom or sophisticated shapes, and small sized implementations.

In accordance with the present disclosure, an electromagnetic (EM) field may be measured at an extremely close location (e.g., within 25 mils) to a surface trace while not physically contacting the surface trace. The proximity of such a measurement may enable better isolation of a single signal more easily than other types of measurement as well as the collection of more of the field generated by the surface trace, thereby enabling a more accurate measurement.

The measurement should be taken close to the source of the EM field to ensure enough energy is available for a proper measurement. The strength of the EM field decays exponentially over distance. In some embodiments, an amplifier (e.g., an active amplifier) may be used to enable enough energy is available for measurement; use of amplification techniques may increase risk of error, and thus closeness to the source of the EM field may be preferred in some embodiments.

In addition to minimizing or preventing interference with the signal, refraining from physically contacting the surface trace to measure signal integrity may prevent wear and/or damage to the surface trace as. A measurement in accordance with the present disclosure may minimize the disturbance of the measurement on the signal being measured. Measurement in accordance with the present disclosure may result in less signal discontinuity and attenuation than using other measurement techniques. The present disclosure therefore enables a removable mechanism for measuring signal strength that preserves both the signal and the hardware.

The present disclosure may be useful for measuring the signal integrity for any EM signal, regardless of speed. The present disclosure may be particularly useful in high speed applications, including the measurement of signals traveling at or in excess of 32 gigabits per second which are typical for electrical link standards. The present disclosure includes a system of measurement using a non-contact field-coupling type of probe placed in close physical proximity to the surface trace; the close proximity may enable the maximization of collection of the EM field. Standard PCB technology may be used in accordance with the present disclosure. In some embodiments, additive manufacturing (such as three-dimensional printing) may be used to generate components of the system.

As direct contact with the surface trace may be avoided, the discontinuity by the probe and the measurement may be minimized; by minimizing the discontinuity, signal integrity at higher speeds may be measured. After measurement, the system may be disconnected for use elsewhere, further decreasing the discontinuity on the measured surface trace.

The present disclosure may enable the freeing up of space on the PCB for other tasks (e.g., minimizing storage space or adding other connections to the PCB). In accordance with the present disclosure, measurements may be taken and then the measurement equipment may be removed before the product is shipped to the customer. The signal may thus be preserved both during measurement as well as maximized for normal operation of the device by removal of the measurement equipment.

A system in accordance with the present disclosure may include a printed circuit board with a microstrip and a conductive structure surrounding the microstrip. The system may include a probe lead in communication with the conductive structure, a first contact pad electrically connected to the conductive structure, and a second contact pad electrically connected to the conductive structure.

Figure 1A:
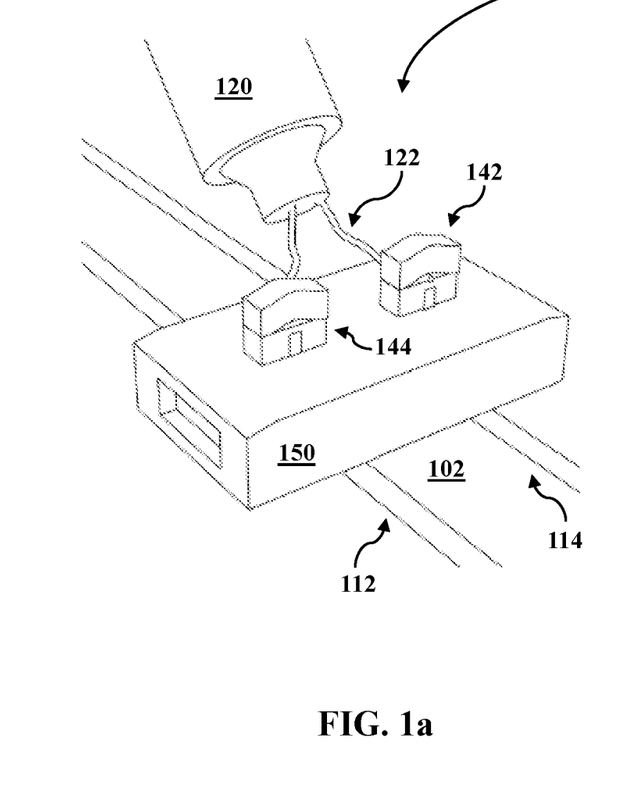
FIG. 1a illustrates a perspective view of a contactless probe system in accordance with some embodiments of the present disclosure.
Figure 1B:
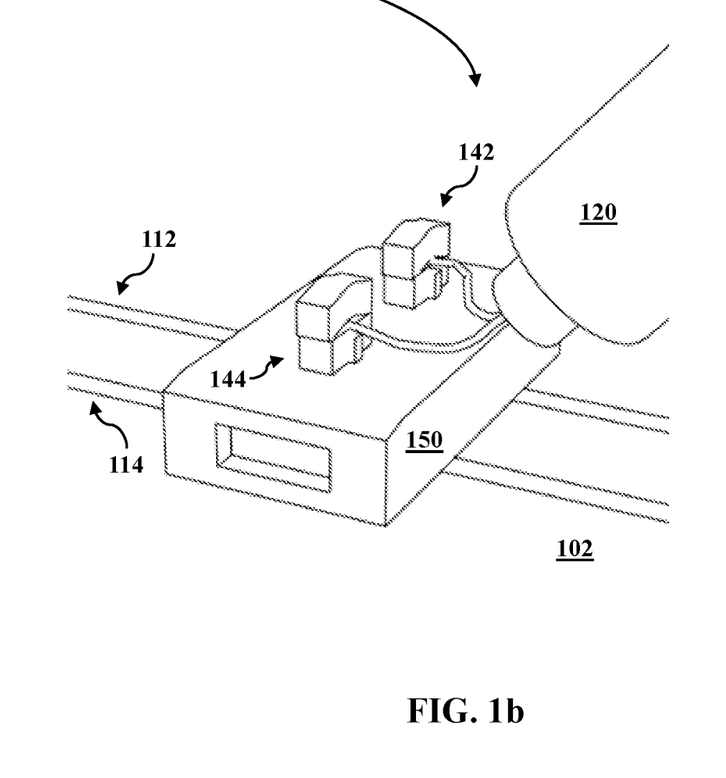
FIG. 1B depicts a perspective view of a contactless probe system in accordance with some embodiments of the present disclosure.

In some embodiments, a system in accordance with the present disclosure may include an enclosure of the conductive structure. FIG. 1a and FIG. 1B illustrate perspective views of a contactless probe system 100 in accordance with some embodiments of the present disclosure. The contactless probe system 100 includes a probe 120 with one or more probe leads 122. In some embodiments, the probe leads 122 may communicate with clamps 142 and 144 mounted on an enclosure 150.

The enclosure 150 may house an internal structure of the contactless probing system 100; the enclosure 150 may be made of materials that obfuscate the internal structure (as shown) or may be transparent such that the internal structure is visible. The internal structure of a system in accordance with the present disclosure is examined in detail in the discussion of FIG. 2. The enclosure 150 may house one or more loops (not shown) surrounding one or more surface traces 112 and 114. The surface traces 112 and 114 may also be referred to as microstrips. The probe 120 may measure the induced current within the loops.

The loops include metallic components that connect two vias and a metallic underbar (such as underbar 538 of FIG. 5b) to form a full loop around a microstrip to generate an induced current within the loop. A loop is a full loop around a microstrip and may include one or more components to close the electrical loop so as to generate the induced current. A loop may include, for example, two vias connected at one end via a metal connector underbar; the vias may be connected at the other end (to close the loop) with an arch which may also be referred to as a metal top cap. A loop may also be referred to as a shorting trace or a signal pin.

The enclosure 150 may be any material that does not significantly interfere with the signal of the microstrip. The enclosure 150 may be made of plastic, for example; the enclosure 150 should not be constructed of a metallic or other material that may significantly interfere with the signal of microstrips. In accordance with some embodiments of the present disclosure, the enclosure 150 is removable.

The enclosure 150 may provide a convenient housing for various components of the contactless probe system 100 such that the components may be quickly and easily removed without damage to the system being measured. In some embodiments, a system ripe for measurement with a contactless probe system 100 may include demarcation in the area where the enclosure 150 may land to collect the measurement. In some embodiments, the demarcation may include one or more landing pads. In some embodiments, an enclosure 150 may not be used but demarcation may be used to indicate a signal measurement zone.

In some embodiments, the enclosure 150 may house a signal pin and a grounding pin. The signal pin is the loop, a metallic encircling of a microstrip to generate an induced current around the microstrip for measurement. The grounding pin may be a metallic component connected to a ground plane. The ground plane may be an internal ground plane. The grounding pin may a via connected to a ground plane.

The contactless probe system 100 may be mounted on a PCB 102 to perform one or more measurements. One or more components of the contactless probe system 100 may be removed after measurement. For example, the probe 120 and the probe leads 122 and the probe 120 may be removed after measurement. In some embodiments, the probe leads 122, the probe 120, the enclosure 150, and the clamping structures 142 and 144 may all be removed after measurement. The clamping structures 142 and 144 may be connected to the enclosure 150 in any number of ways, both those currently known in the art as well as others which may yet be developed. In some embodiments, one or more top caps of one or more loops may be housed by the enclosure 150 and removed along with the other components.

In some embodiments, the one or more loops (not shown) surrounding the surface traces 112 and 114 has a removable top portion that nests in an embedded portion such that nesting the removable top portion in the embedded portion closes the electrical loop around the surface traces 112 and 114. In such embodiments, the top portions of the loops may also be removed such that the embedded portion remains in the PCB.

Figure 2:
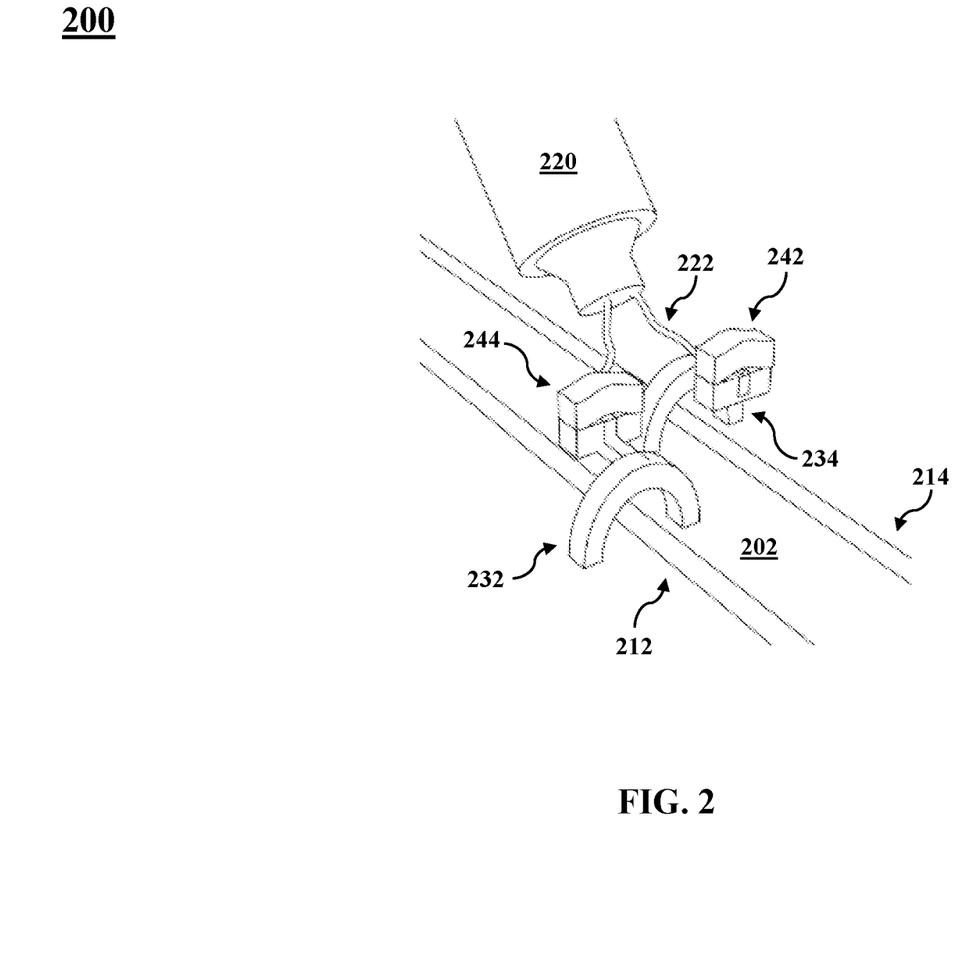
FIG. 2 illustrates a perspective view of a contactless probe system in accordance with some embodiments of the present disclosure.

In some embodiments, a conductive structure (e.g., an electrical loop) is at least partially embedded in the printed circuit board. FIG. 2 depicts a perspective view of a contactless probe system 200 in accordance with some embodiments of the present disclosure. The contactless probe system 200 includes a probe 220 with one or more probe leads 222. In some embodiments, the probe leads 222 may communicate with clamps 242 and 244. The clamps 242 and 244 may be mounted directly on loops 232 and 234 forming complete loops around the surface traces 212 and 214 on the PCB 202 or may be mounted on an enclosure (such as enclosure 150 in FIG. 1). The probe 220 may measure the induced current within the loops 232 and 234.

One or more loops 232 and 234 surround one or more surface traces 212 and 214. The loops 232 and 234 are partially embedded into the PCB 202 to fully encompass the surface traces 212 and 214. The contactless probe system 200 is removably mounted on a PCB 202 to perform one or more measurements such that one or more components may be removed.

The contactless probe system 200 is mounted on a PCB 202 to perform one or more measurements such that one or more components may be removed after measurement. For example, the probe 220 and the probe leads 222 may be removed after measurement. In some embodiments, the clamping structures 242 and 244, the probe 220, and the probe leads 222 may be removed after measurement. In some embodiments, the one or more loops 232 and 234 surrounding the surface traces 212 and 214 have a removable top portion that nests in an embedded portion such that nesting the removable top portion in the embedded portion closes the electrical loop around the surface traces 212 and 214. In such embodiments, the top portions of the loops 232 and 234 may also be removed such that the embedded portion remains in the PCB 202.

The loops 232 and 234 may be referred to as archways or conductive structures. In some embodiments, a system in accordance with the present disclosure may include a removal facilitation handle (not shown) connected to the conductive structure. In some embodiments, such removal facilitation handle (e.g., pull knob, segment of increased friction for a better hold, or other grip improvement mechanism) may be connected directly to one or more of the loops 232 and 234. In some embodiments, the removal facilitation handle may be connected to the conductive structure via an enclosure housing the conductive structure.

In some embodiments, a system in accordance with the present disclosure may include a clamping structure connected to the conductive structure. In some embodiments of the present disclosure, the probe lead may communicate with the conductive structure via the clamping structure.

In some embodiments, a system in accordance with the present disclosure may include an additional conductive structure surrounding an additional microstrip. Some embodiments of the present disclosure may also include an additional probe lead in communication with the additional conductive structure.

In some embodiments, a system in accordance with the present disclosure may include the conductive structure, the first contact pad, and the second contact pad may extend above a surface of the printed circuit board.

Figure 3:
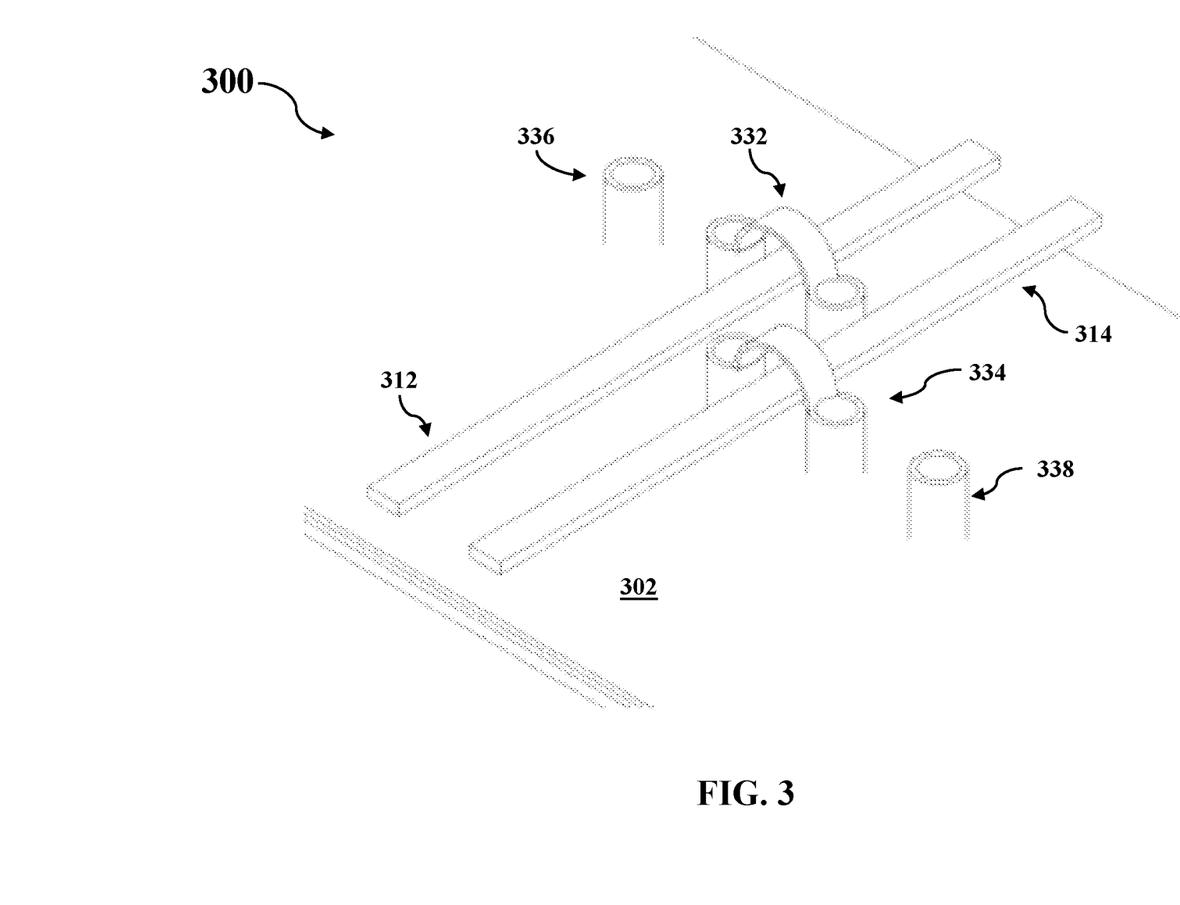
FIG. 3 depicts a contactless probe differential structure in accordance with some embodiments of the present disclosure.

FIG. 3 illustrates a contactless probe differential structure 300 in accordance with some embodiments of the present disclosure. FIG. 3 shows the contactless probe differential structure 300 with via staggering. The contactless probe differential structure 300 includes archways 332 and 334 completing electrical loops around surface traces 312 and 314. The contactless probe differential structure 300 further includes grounding vias 336 and 338.

Figure 4:
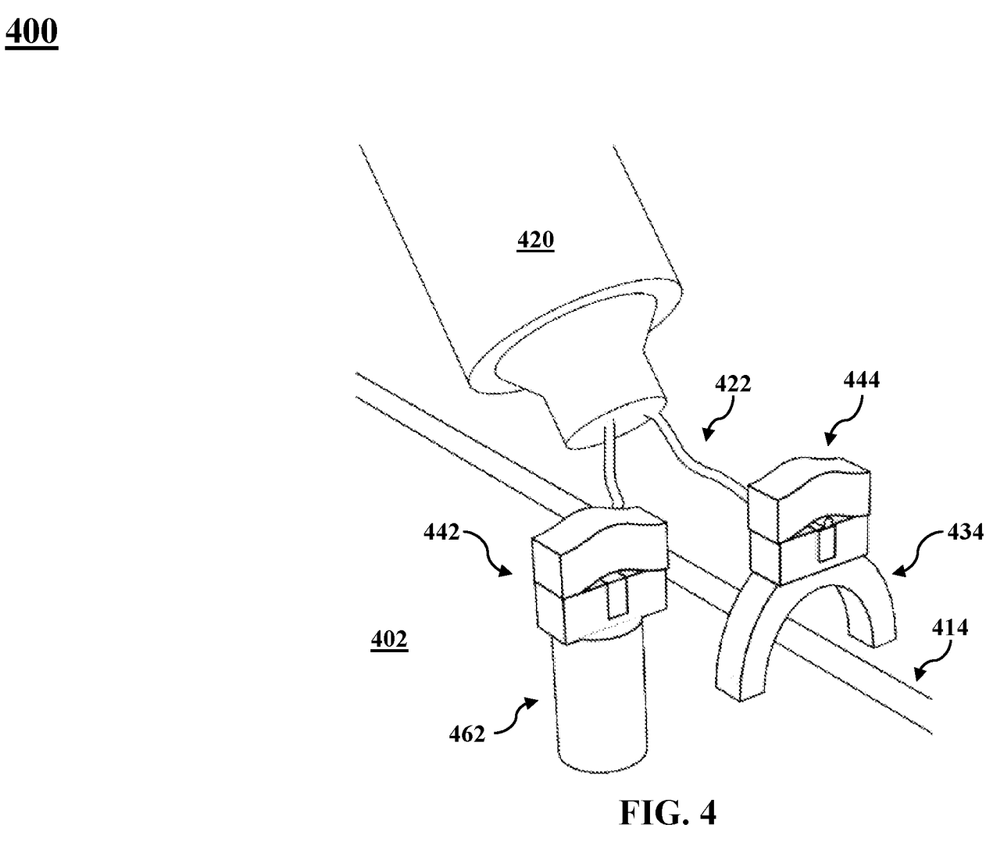
FIG. 4 illustrates a perspective view of a contactless probe system in accordance with some embodiments of the present disclosure.

FIG. 4 depicts a perspective view of a contactless probe system 400 in accordance with some embodiments of the present disclosure. The contactless probe system 400 includes a probe 420 with one or more probe leads 422. In some embodiments, the probe leads 422 may communicate with a clamp 444 mounted on a loop 434 surrounding a surface trace 414. In some embodiments, the contactless probe system 400 is a single-ended probe and may thus include a grounding via 462. The probe 420 may measure the induced current within the loop 434.

The contactless probe system 400 is mounted on a PCB 402 to perform one or more measurements such that one or more components may be removed after measurement. For example, the probe 420 and the probe leads 422 may be removed after measurement. In some embodiments, the clamping structures 442 and 444, the probe 420, and the probe leads 422 may all be removed after measurement. In some embodiments, the loop 434 surrounding a surface trace 414 and/or the grounding via 462 may have a removable top portion nested in an embedded portion. Nesting a removable top portion of the loop 434 in the embedded portion may close an electrical loop around the surface trace 414, and nesting a removable top portion of a grounding via 462 may enable the grounding of a connected probe 420. In such embodiments, the top portion of the loop 434 and/or the grounding via 462 may be removed such that the embedded portion remains in the PCB 402.

Figure 5A:
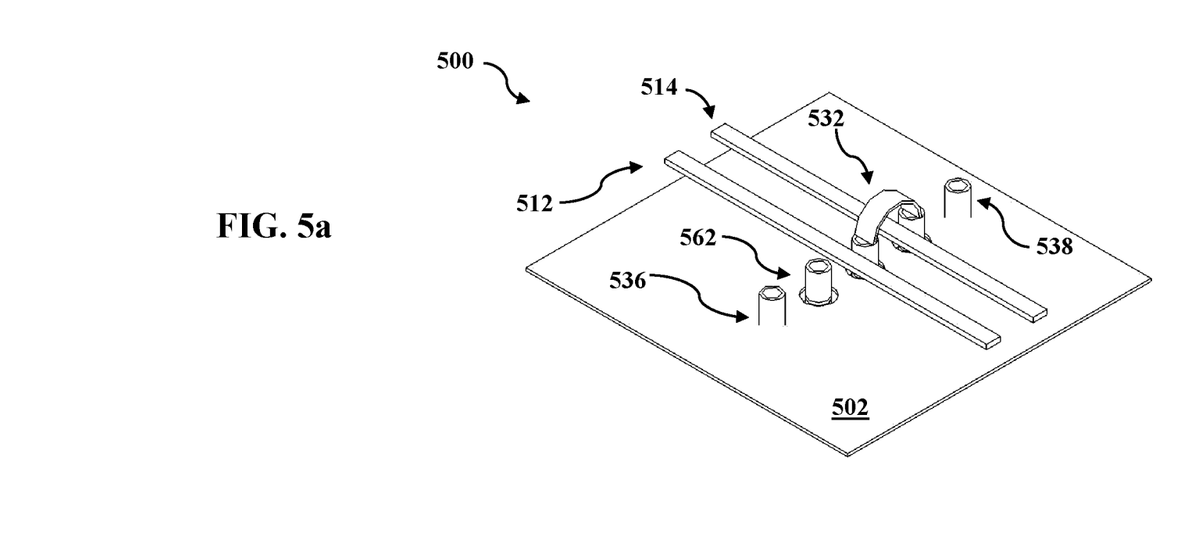
FIG. 5a depicts a perspective view of a contactless probe differential structure in accordance with some embodiments of the present disclosure.
Figure 5B:
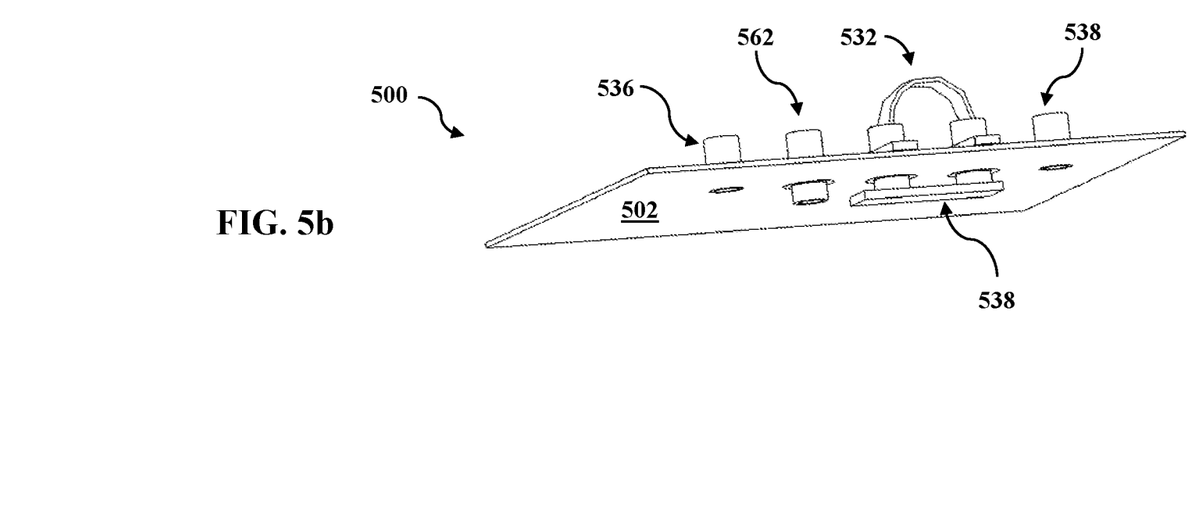
FIG. 5b illustrates a perspective view of a contactless probe differential structure in accordance with some embodiments of the present disclosure.

FIG. 5a and FIG. 5b illustrate perspective views of a contactless probe differential structure 500 in accordance with some embodiments of the present disclosure. The contactless probe differential structure 500 may include surface traces 512 and 514 on a PCB 502. The contactless probe differential structure 500 may include a loop 532 encircling one of the surface traces 514 and a grounding via 562 in the PCB 502 adjacent the loop 562. The loop 532 may include an underbar 538. The contactless probe differential structure 500 may include other vias 536 and 538.

In some embodiments, part or all of the section of the PCB 502 within the loop 532 may be removed or otherwise not used. Minimizing the PCB 502 in the loop 532 may maximize the signal available for measurement. The loop 532 will be electrically isolated from the PCB 502. In some embodiments, only a probe (such as probe 120 as shown in FIG. 1) will contact the loop 532. In some embodiments, the underbar 538 or other portion of the loop 532 may connect to part of the PCB 502; regardless, the loop 532 will remain electrically isolated from the PCB 502 (e.g., the loop 532 may be connected to the PCB 502 by way of an electrical insulator). The section of the PCB 502 within the loop 532 may be small enough (e.g., a few mils) such that the surface trace 514 may not need the PCB 502 in that section for support. In some embodiments, minimizing the PCB 502 within the loop 532 may enable the loop 532 to be made closer to the measured surface trace 514 which may enable the collection and measurement of a stronger signal.

Figure 6:
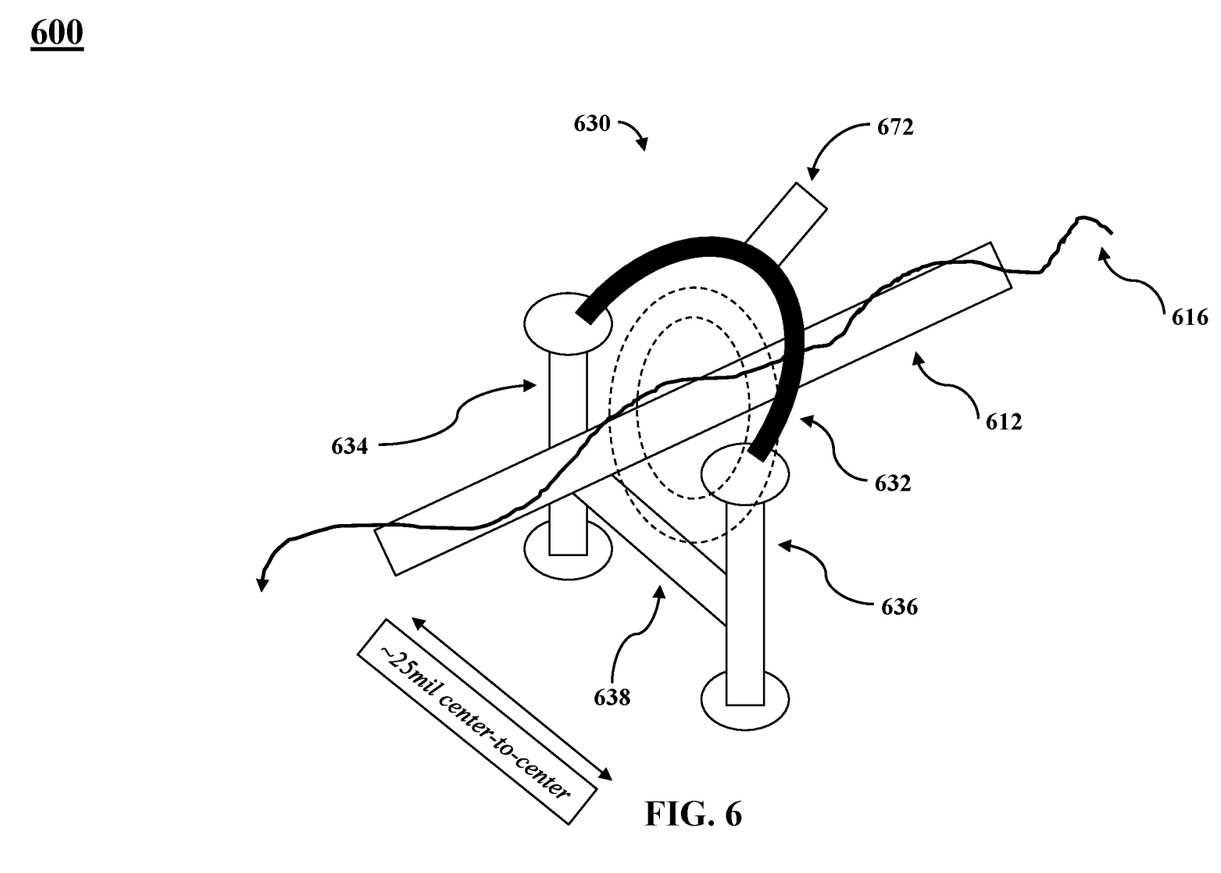
FIG. 6 depicts a probe differential structure in accordance with some embodiments of the present disclosure.

In some embodiments, a system in accordance with the present disclosure may include a probe landing pad connected to the conductive structure. FIG. 6 depicts a contactless probe differential structure 600 in accordance with some embodiments of the present disclosure. The contactless probe differential structure 600 may include a loop 630 with a probe landing pad 672. The probe landing pad 672 may be oriented in any way so as to facilitate connection with a probe (such as the probe 120 shown in FIG. 1).

The orientation of the probe landing pad 672 may be discussed in reference to its relation to the arch portion 632 of the loop 630, the vias 634 and 363 the arch portion 632 connects, or the PCB. In some embodiments, the probe landing pad 672 may be vertical (e.g., parallel to the vias 634 and 636), horizontal (e.g., parallel to the PCB), or diagonal (such that the probe landing pad 672 is neither vertical nor horizontal). In some embodiments, the arch portion 632 may be at one angle to the vias 634 and 636 and the probe landing pad 672 is parallel thereto. In some embodiments, the arch portion 632 may be at one angle to the vias 634 and 636 and the probe landing pad 672 may be at a different angle (e.g., not parallel to the arch portion 632).

The loop 630 may surround a microstrip 612 built into a PCB (not shown) over which a signal 616 may travel. The loop 630 may include an arch portion 632, one or more vias 634 and 636, and an underbar 638 to complete the loop 630 around the microstrip 612. The vias 634 and 636 may be built into the PCB.

The contactless probe differential structure 600 may have a diameter of approximately 25 mils measured from the center of one via 634 of the loop 630 to the center of the other via 636 of the loop 630. In some embodiments of the present disclosure, the diameter may be up to 125 mils. The size may be modified as helpful or necessary or helpful for various applications. It may be preferable to minimize the size of the loop 630 around the microstrip 612 to maximize the signal strength for optimal measurement. In some embodiments, the size (e.g., diameter) of the loop 630 may be the minimized as minimizing the size of the loop 630 may maximize field collection.

Figure 7:
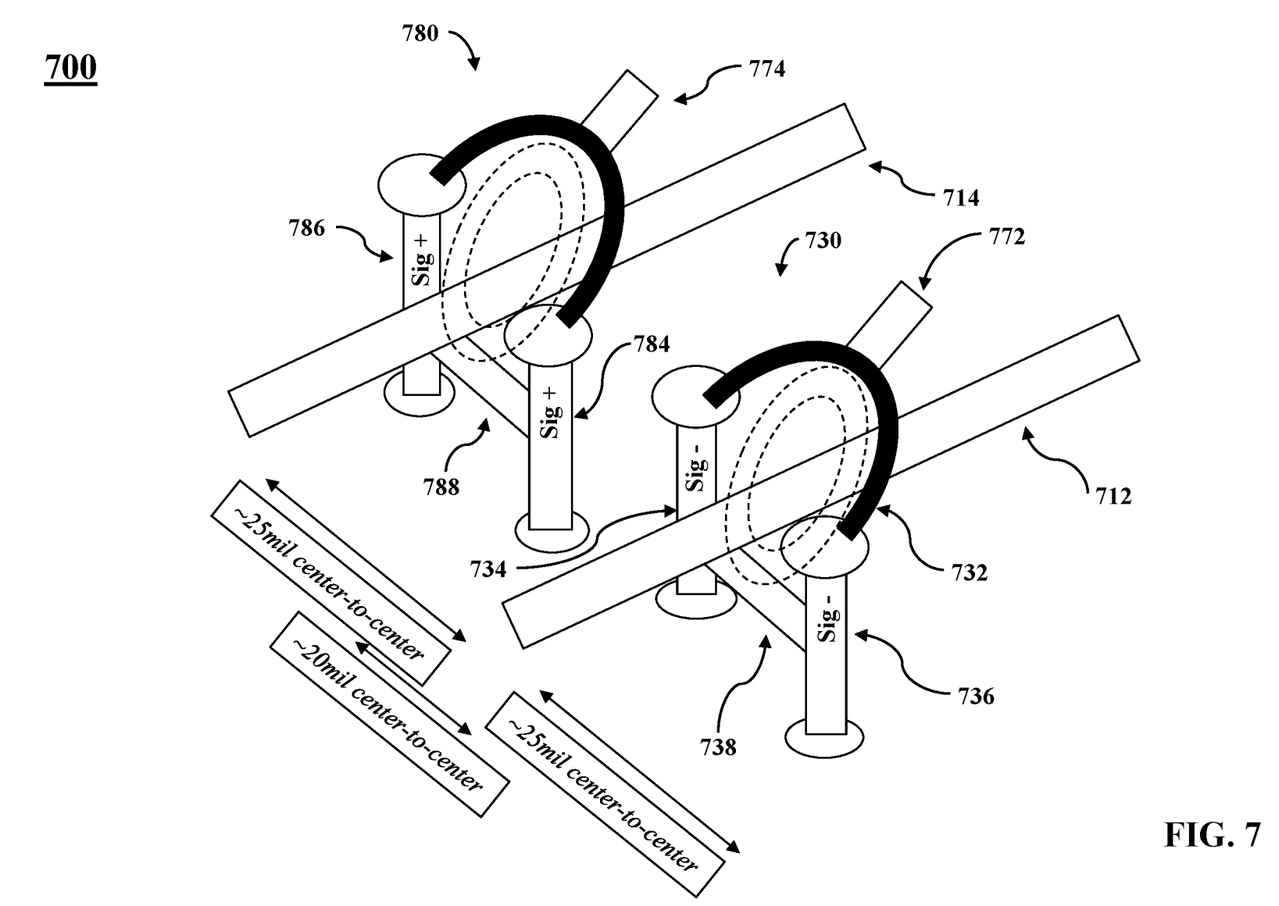
FIG. 7 illustrates a probe differential structure in accordance with some embodiments of the present disclosure.

FIG. 7 illustrates a contactless probe differential structure 700 in accordance with some embodiments of the present disclosure. The contactless probe differential structure 700 may include two loops 730 and 780 mounted side-by-side on a PCB (not shown). Each loop 730 and 780 may have a probe landing pad 772 and 774. The loops 730 and 780 may surround microstrips 712 and 714 built into a PCB over which signals may travel. The loops 730 and 780 may include arch portions 732 and 782, vias 734, 736, 784, and 786, and underbars 738 and 788 to complete the loops 730 and 780 around the microstrips 712 and 714. The vias 734, 736, 784, and 786 may be built into the PCB.

The loops 730 and 780 may have distinct roles to perform. For example, the vias 786 and 788 of a first loop 780 may provide the negative signal for the contactless probe differential structure 700, and the vias 734 and 738 one of a second loop 730 may provide a positive signal. Each of the vias 734, 736, 784, and 786 form a part of the signal loop.

The contactless probe differential structure 700 may have a diameter of approximately 25 mils measured from the center of one via 734 and 784 of each loop 730 and 780 to the center of the other via 736 and 786 of the loop 730 and 780. Similarly, the measurement from the center of one loop 730 to the center of the other loop 780 may be 20 mils. The size may be modified as helpful or necessary or helpful for various applications. It may be preferable to minimize the size of the loop 730 around the microstrip 712 to maximize the signal strength for optimal measurement.

Figure 8:
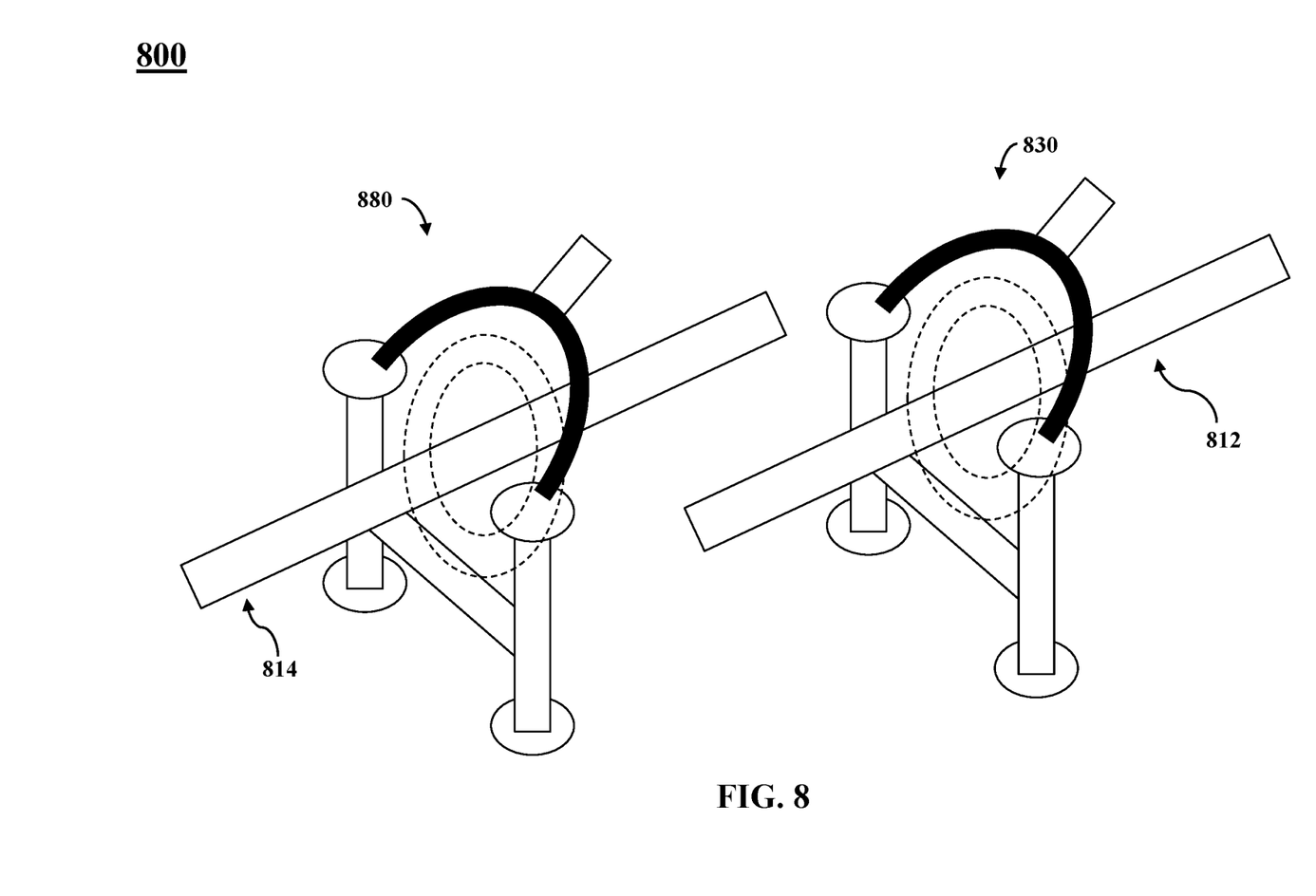
FIG. 8 depicts a contactless probe differential structure in accordance with some embodiments of the present disclosure.

FIG. 8 depicts a contactless probe differential structure 800 in accordance with some embodiments of the present disclosure. The contactless probe differential structure 800 includes loops 830 and 880 constructed over microstrips 812 and 814 with via staggering. Such an embodiment may reduce the area required for occupation to measure signal integrity.

Such an embodiment may result in signal delay because the signal is measured at slightly different times. In some embodiments, a method in accordance with the present disclosure may include compensating for a signal delay. Signal delay may be compensated for by using compensatory wiring chances such as the configuration shown in FIG. 9. Compensating for signal delay may result in the signal measurement to be aligned such that the data appears to have been collected at the same time.

Figure 9:
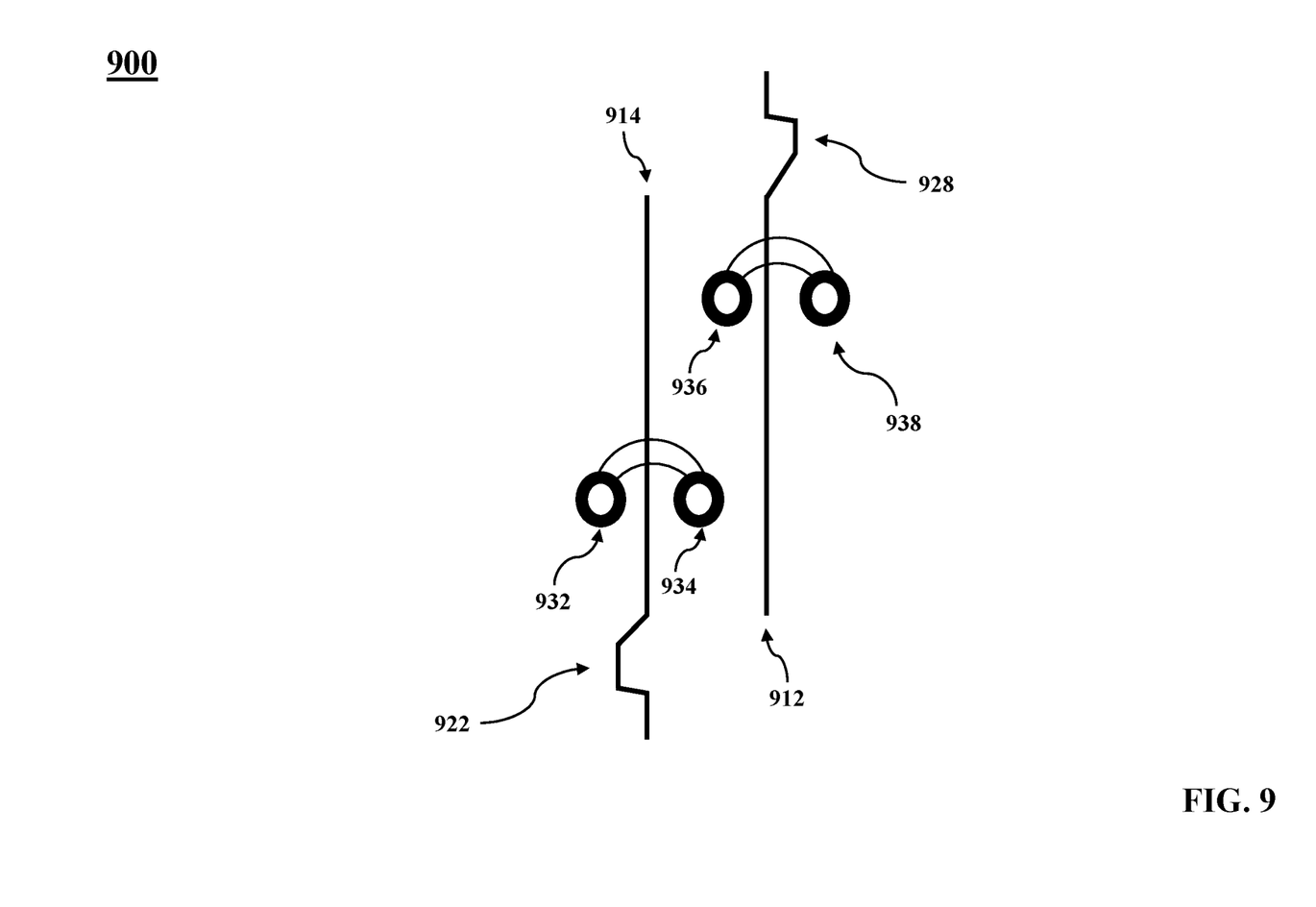
FIG. 9 illustrates via staggering of a probe differential structure for delay compensation in accordance with some embodiments of the present disclosure.

FIG. 9 illustrates via staggering 900 of a contactless probe differential structure for delay compensation in accordance with some embodiments of the present disclosure. The vias 932, 934, 936, and 938 are shown straddling microstrips 914 and 912. One pair of vias 932 and 934 offer a negative charge and the other pair of vias 936 and 938 offer a positive charge. Each of the vias 932, 934, 936, and 938 form a part of the signal loop.

Each microstrip 912 and 914 is configured to include a mitigating delay. As the signal passes from one end to the other and is measured in between, the signal traverses a pre-delay 922 and a post-delay 928. These signal delays may be calculated and implemented to specifically compensate for the delays anticipated as a result of implementing certain embodiments of the present disclosure, such as for via staggering.

In some embodiments, only a pre-delay may be implemented. In some embodiments, only a post-delay may be implemented. In some embodiments, both a pre-delay and a post-delay may be implemented.

In some embodiments of the present disclosure, a method may include surrounding a microstrip with a conductive structure to form a first portion and embedding the first portion in a printed circuit board. A method in accordance with the present disclosure may include electrically connecting a first contact pad and a second contact pad to the conductive structure and extending a second portion above a surface of the printed circuit board.

Figure 10:
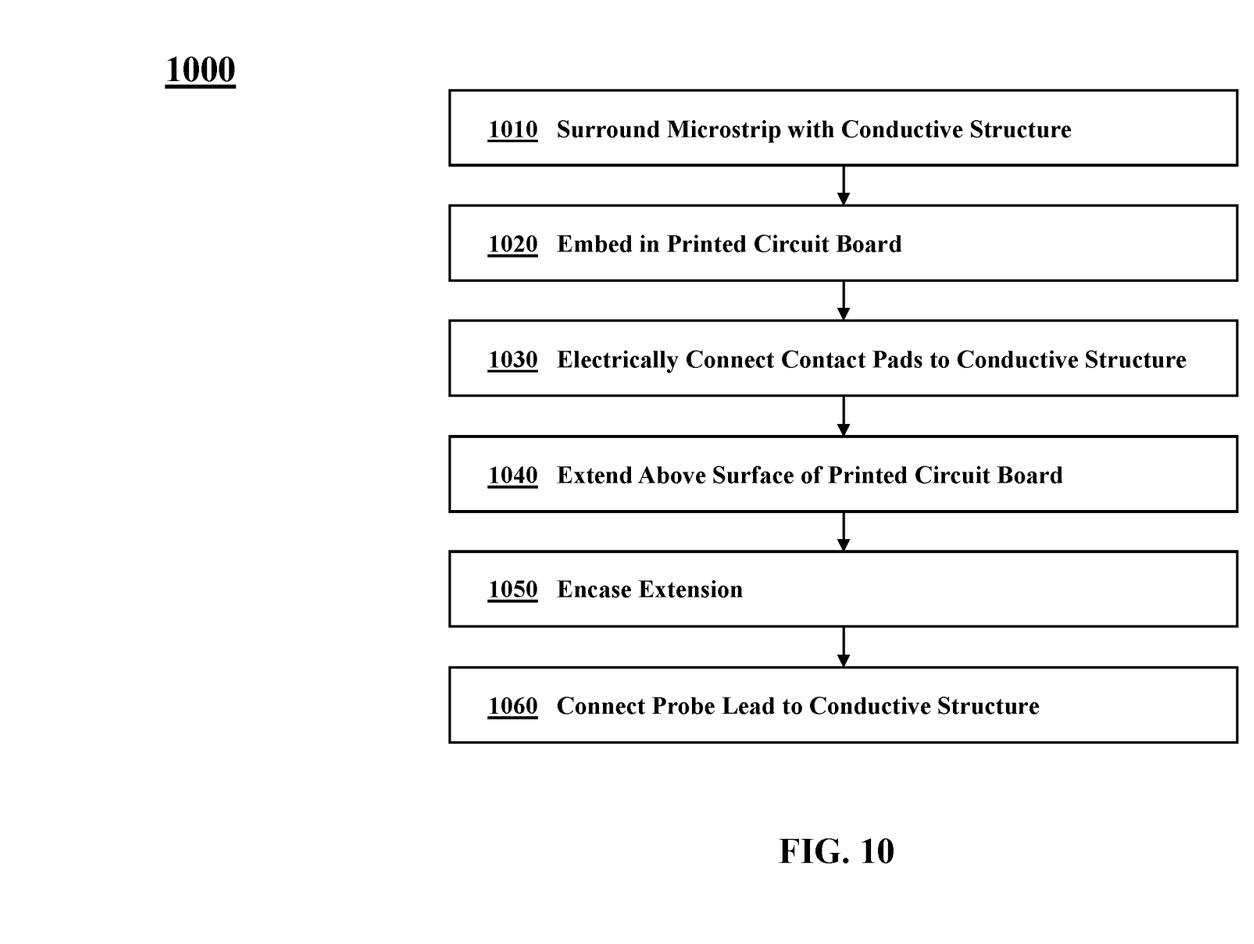
FIG. 10 depicts a method in accordance with some embodiments of the present disclosure.

FIG. 10 depicts a method 1000 in accordance with some embodiments of the present disclosure. The method 1000 includes an operation to surround a microstrip with a conductive structure 1010 and an operation to embed the conductive structure in a PCB 1020. The method 1000 further includes an operation to electrically connect contact pads to the conductive structure 1030 and an operation to extend the contact pads above the surface of the PCB 1040. The method 1000 may include an operation to encase the extension 1050 in an enclosure and an operation to connect a probe lead to the conductive structure 1060.

In some embodiments of the present disclosure, the method will include other operations, exclude one or more of the aforementioned operations, and/or use the operations in differing orders. In some embodiments of the present disclosure, for example, the manufacturing of a PCB may be included, and an embedded portion may be embedded in the PCB at an initial manufacture. Such an embedded portion may be designed to nest with a top portion such that the top portion completes an electrical circuit around a microstrip.

In some embodiments, a method in accordance with the present disclosure may include producing the second portion via additive manufacturing.

Some embodiments may include a first portion and a second portion such that the first portion includes a PCB, microstrip, and embedded portion of a measurement device and a second portion includes a top portion of the measurement device. A method for such an embodiment may include encasing the second portion in an enclosure. The second portion may be capable of removable coupling with the first portion. During coupling, the measurement device may be able to measure signal integrity with a contactless probe because the electrical loop around the microstrip is complete; the second portion may be removed for use with another device.

In some embodiments, a method in accordance with the present disclosure may include connecting a probe lead to the conductive structure. The connection may be a communicative coupling such that the probe lead is not in physical contact with the conductive structure. The probe lead may be in physical contact with a clamp that directly communicates with one or more loops, or the probe lead may be directly inserted into the loop to measure the induced current.

A method in accordance with the present disclosure may include providing a near field structure proximate a surface of a printed circuit board and electrically connecting a probe lead to the near field structure. The near field structure may include a conductive structure surrounding a microstrip on the printed circuit board and a first contact pad electrically connected to the conductive structure. The near field structure may also include a second contact pad electrically connected to the conductive structure. The first and second contact pads may extend above a surface of the printed circuit board.

Figure 11:
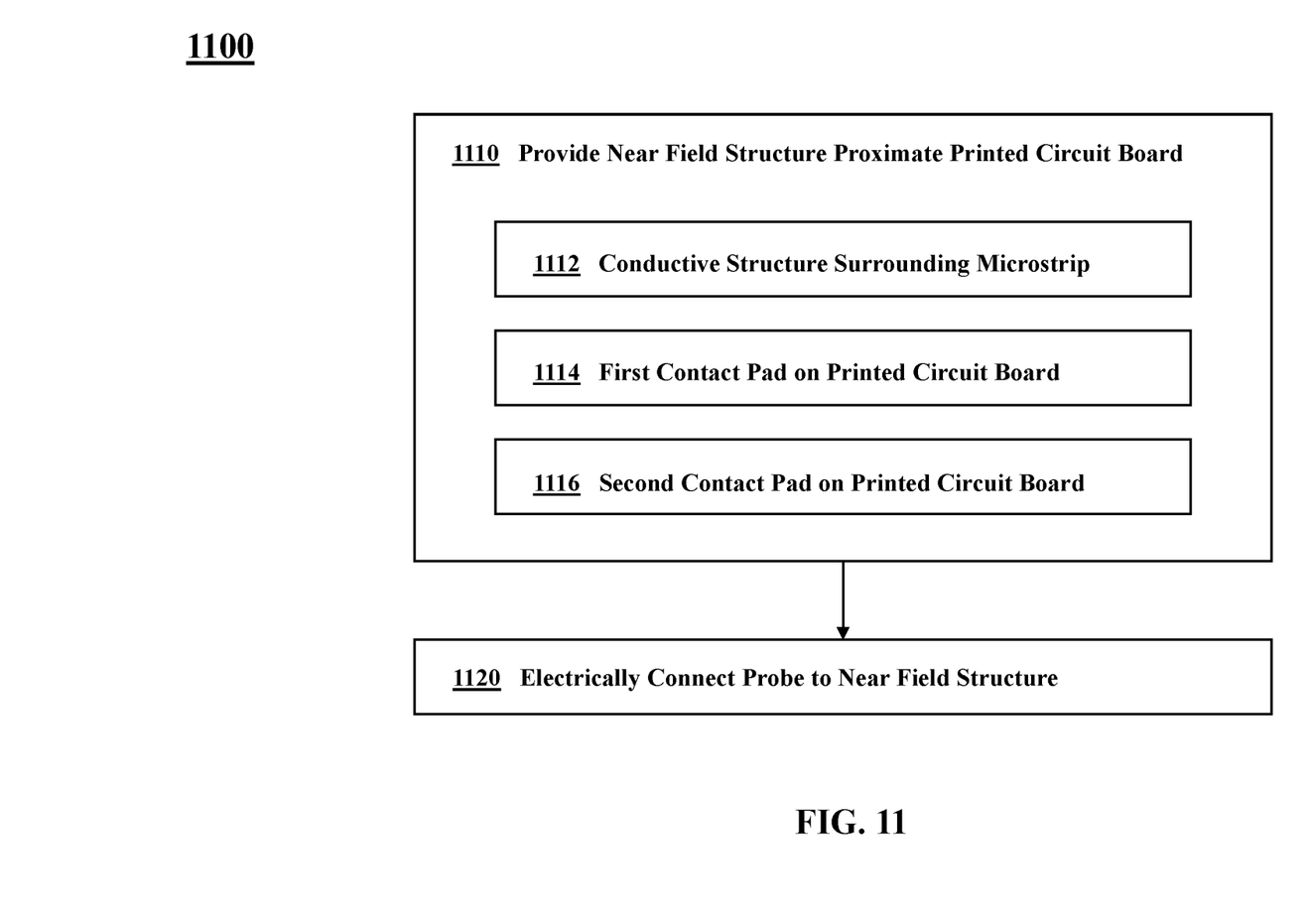
FIG. 11 depicts a method in accordance with some embodiments of the present disclosure.

FIG. 11 depicts a method 1100 in accordance with some embodiments of the present disclosure. The method 1100 may include the operation of providing a near field structure proximate a printed circuit board 1110 and the operation of electrically connecting a probe to the near field structure 1120. The near field structure 1120 may include a conductive structure surrounding a microstrip 1112, a first contact pad on a printed circuit board 1114, and a second contact pad on a printed circuit board 1116.

In some embodiments, the first contact pad on a printed circuit board 1114 may be located on a loop which may direct the contained induced current for measurement and the second contact pad on a printed circuit board 1116 is a grounding contact pad. In some embodiments, both the first contact pad on a printed circuit board 1114 and the second contact pad on a printed circuit board 1116 are attached to loops.

In some embodiments, a method in accordance with the present disclosure may include compensating for a signal delay. In some embodiments, the near field structure may include an encasement of the conductive structure. In some embodiments, the near field structure may include a clamping structure connected to the conductive structure. In some embodiments, the near field structure may include an additional conductive structure surrounding an additional microstrip.

Aspects of the present disclosure are described herein with reference to flowchart illustrations and/or block diagrams of methods, apparatus (systems), and computer program products according to embodiments of the disclosure. It will be understood that each block of the flowchart illustrations and/or block diagrams, and combinations of blocks in the flowchart illustrations and/or block diagrams, can be implemented by computer readable program instructions. For example, the method 1000 of FIG. 10 may be provided as computer readable program instructions to a computer, and the computer may perform the operations of the method 1000.

These computer readable program instructions may be provided to a processor of a computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus, or other device to produce a computer implemented process such that the instructions which execute on the computer, other programmable apparatus, or other device implement the functions/acts specified in the flowchart and/or block diagram block or blocks.

The flowchart and block diagrams in the figures illustrate the architecture, functionality, and operation of possible implementations of systems, methods, and computer program products according to various embodiments of the present disclosure. In this regard, each block in the flowchart or block diagrams may represent a module, segment, or portion of instructions which comprises one or more executable instructions for implementing the specified logical function(s). In some alternative implementations, the functions noted in the blocks may occur out of the order noted in the figures. For example, two blocks shown in succession may, in fact, be accomplished as one step, executed concurrently, substantially concurrently, in a partially or wholly temporally overlapping manner, or the blocks may sometimes be executed in the reverse order depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Although the present disclosure has been described in terms of specific embodiments, it is anticipated that alterations and modification thereof will become apparent to the skilled in the art. The descriptions of the various embodiments of the present disclosure have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application, or the technical improvement over technologies found in the marketplace or to enable others of ordinary skill in the art to understand the embodiments disclosed herein. Therefore, it is intended that the following claims be interpreted as covering all such alterations and modifications as fall within the true spirit and scope of the disclosure.

What is claimed is:

1. A system, said system comprising:
   a printed circuit board with a microstrip, wherein said printed circuit board has a first surface, wherein said first surface is on a first plane, and wherein said microstrip is on said first surface of said printed circuit board;
   a conductive structure surrounding said microstrip, wherein said conductive structure extends along a second plane, and wherein said second plane is substantially perpendicular to said first plane;
   a probe lead in communication with said conductive structure;
   a first contact pad electrically connected to said conductive structure; and
   a second contact pad electrically connected to said conductive structure.

2. The system of claim 1, wherein:
   said conductive structure is at least partially embedded in said printed circuit board.

3. The system of claim 1, further comprising:
   an enclosure of said conductive structure.

4. The system of claim 1, further comprising:
   a removal facilitation handle connected to said conductive structure.

5. The system of claim 1, further comprising:
   a probe landing pad connected to said conductive structure.

6. The system of claim 1, further comprising:
   a clamping structure connected to said conductive structure.

7. The system of claim 6, wherein:
   said probe lead communicates with said conductive structure via said clamping structure.

8. The system of claim 1, further comprising:
   an additional conductive structure surrounding an additional microstrip.

9. The system of claim 8, further comprising:
   an additional probe lead in communication with said additional conductive structure.

10. The system of claim 1, wherein:
    said conductive structure, said first contact pad, and said second contact pad extend above a surface of said printed circuit board.

11. A method, said method comprising:
    surrounding a microstrip with a conductive structure to form a first portion, wherein said conductive structure extends along a structure plane;
    embedding said first portion in a printed circuit board, wherein said printed circuit board has a surface, wherein said surface is on a surface plane, wherein said microstrip is on said surface of said printed circuit board, and wherein said surface plane is substantially perpendicular to said structure plane;
    connecting, electrically, a first contact pad and a second contact pad to said conductive structure; and
    extending a second portion above said surface of said printed circuit board.

12. The method of claim 11, further comprising:
    producing said second portion via additive manufacturing.

13. The method of claim 11, further comprising:
    encasing said second portion in an enclosure.

14. The method of claim 11, further comprising:
    connecting a probe lead to said conductive structure.

15. The method of claim 11, further comprising:
    compensating for a signal delay.

16. A method, said method comprising:
    providing a near field structure proximate a surface of a printed circuit board, wherein said surface is on a first plane, wherein said near field structure comprises:
      a conductive structure surrounding a microstrip on said printed circuit board, wherein said microstrip is on said surface of said printed circuit board, wherein said conductive structure extends along a second plane, and wherein said second plane is substantially perpendicular to said first plane;
      a first contact pad electrically connected to said conductive structure, wherein said first contact pad extends above a surface of said printed circuit board; and
      a second contact pad electrically connected to said conductive structure, wherein said second contact pad extends above said surface of said printed circuit board; and
    connecting, electrically, a probe lead to said near field structure.

17. The method of claim 16, further comprising:
    compensating for a signal delay.

18. The method of claim 16, wherein said near field structure further comprises:
    an enclosure of said conductive structure.

19. The method of claim 16, wherein said near field structure further comprises:
    a clamping structure connected to said conductive structure.

20. The method of claim 16, wherein said near field structure further comprises:
    an additional conductive structure surrounding an additional microstrip.

* * * * *